(12) United States Patent
Jiang et al.

(10) Patent No.: US 11,841,597 B2
(45) Date of Patent: Dec. 12, 2023

(54) ARRAY SUBSTRATE AND DISPLAY PANEL (71) Applicant: TCL China Star Optoelectronics Technology Co., Ltd., Guangdong (CN)

(72) Inventors: Zhixiong Jiang, Guangdong (CN); Sheng Sun, Guangdong (CN); Yoonsung Um, Guangdong (CN); Woosung Son, Guangdong (CN); Meng Chen, Guangdong (CN); Wuguang Liu, Guangdong (CN); Jubin Li, Guangdong (CN); Zhiwei Tan, Guangdong (CN); Haiyan Quan, Guangdong (CN); Kaili Qu, Guangdong (CN); Chuwei Liang, Guangdong (CN); Ziqi Liu, Guangdong (CN); Lintao Liu, Guangdong (CN); Ting Li, Guangdong (CN); Sikun Hao, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 520 days.

(21) Appl. No.: 17/051,457

(22) PCT Filed: May 20, 2020

(86) PCT No.: PCT/CN2020/091249
§ 371 (c)(1),
(2) Date: Oct. 29, 2020

(87) PCT Pub. No.: WO2021/227105
PCT Pub. Date: Nov. 18, 2021

(65) Prior Publication Data
US 2023/0161209 A1 May 25, 2023

(30) Foreign Application Priority Data
May 9, 2020 (CN) .......................... 202010386966.9

(51) Int. Cl.
*G02F 1/1368* (2006.01)
*G02F 1/1343* (2006.01)
(Continued)

(52) U.S. Cl.
CPC ...... *G02F 1/1368* (2013.01); *G02F 1/133514* (2013.01); *G02F 1/134309* (2013.01);
(Continued)

(58) Field of Classification Search
CPC ............. G02F 1/1335; G02F 1/133514; G02F 1/1343; G02F 1/134309; G02F 1/1362;
(Continued)

(56) References Cited

U.S. PATENT DOCUMENTS

2012/0032195 A1* 2/2012 Li .......................... H01L 27/124
257/E33.053
2017/0108723 A1* 4/2017 No ..................... G02F 1/133345

FOREIGN PATENT DOCUMENTS

| CN | 101097962 | 1/2008 |
|---|---|---|
| CN | 104865763 | 8/2015 |

(Continued)

OTHER PUBLICATIONS

Patent Translate CN 107991818.*

*Primary Examiner* — Thoi V Duong (57) ABSTRACT

The present disclosure provides an array substrate and a display panel including the same. The array substrate includes a plurality of pixel units. Each of the pixel units includes a main pixel electrode, a sub-pixel electrode, a first thin film transistor (TFT) electrically connected to the sub-pixel electrode, a second TFT electrically connected to the first TFT, and a third TFT electrically connected to the main pixel electrode. The first TFT includes a first channel and a first semiconductor layer. The first channel includes two or more subchannels. The first semiconductor layer
(Continued)

includes two or more semiconductor sublayers. Each of the semiconductor sublayers is disposed in a corresponding subchannel.

12 Claims, 7 Drawing Sheets

(51) Int. Cl.
*G02F 1/1362* (2006.01)
*G02F 1/1335* (2006.01)
*H01L 27/12* (2006.01)

(52) U.S. Cl.
CPC .... *G02F 1/136286* (2013.01); *H01L 27/1222* (2013.01); *G02F 1/13624* (2013.01)

(58) Field of Classification Search
CPC ............. G02F 1/136286; G02F 1/1368; H01L 27/1222
See application file for complete search history.

(56) References Cited

FOREIGN PATENT DOCUMENTS

| | | |
|---|---|---|
| CN | 107991818 | 5/2018 |
| KR | 10-2007-0080130 | 8/2007 |

\* cited by examiner

FIG. 8

ARRAY SUBSTRATE AND DISPLAY PANEL

RELATED APPLICATIONS

This application is a National Phase of PCT Patent Application No. PCT/CN2020/091249 having International filing date of May 20, 2020, which claims the benefit of priority of Chinese Patent Application No. 202010386966.9 filed on May 9, 2020. The contents of the above applications are all incorporated by reference as if fully set forth herein in their entirety.

FIELD AND BACKGROUND OF THE INVENTION

The present disclosure relates to the technical field of display, and particularly to an array substrate and a display panel.

With the development of display technology, accuracy requirements for structural dimensions of thin film transistors (TFTs) in display panels have become higher. In a pixel structure comprising a main pixel and a sub-pixel, a brightness of the main pixel is controlled by a main TFT, and a brightness of the sub-pixel is controlled by a sub-TFT and a voltage-dividing TFT. The brightness of the sub-pixel is controlled by a voltage-dividing ratio of the voltage-dividing TFT to the sub-TFT. A specific voltage-dividing ratio of the voltage-dividing TFT to the sub-TFT is controlled by a ratio of a width of a voltage-dividing channel of the voltage-dividing TFT to a width of a sub-channel of the sub-TFT.

Figure 1:
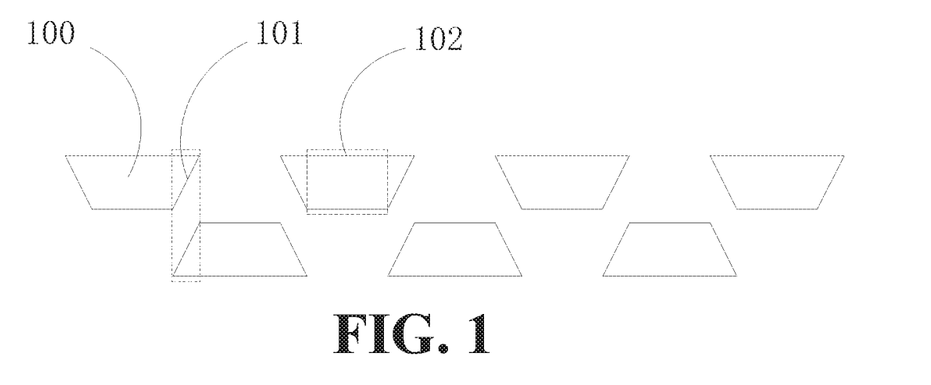
FIG. 1 is a schematic structural diagram of a prism combination for an exposure process in the prior art.

Currently, an actual manufacturing process of channel structures of the sub-TFT and the voltage-dividing TFT comprises: sequentially forming a gate metal layer, an insulating layer, and a source/drain metal layer, then patterning the source/drain metal layer by an exposure process, and then forming the sub-channel of the sub-TFT and the voltage-dividing channel of the voltage-dividing TFT by an etching process using the patterned source/drain metal layer. Currently, a Nikon machine comprising a combination of prisms 100 as shown in FIG. 1 is commonly used in the exposure process. Because there is a certain difference between an exposure amount of a prism connecting portion 101 overlapping between the prisms 100 and an exposure amount of a prism body 102 of each of the prisms 100, there is a certain difference between an exposure amount of the insulating layer at the prism connecting portion 101 and an exposure amount of the insulating layer at the prism body 102, thereby affecting a size of the patterned insulating layer. Therefore, at the prism connection portion 101, a width of the sub-channel of the sub-TFT and a width of the voltage-dividing channel of the voltage-dividing TFT simultaneously become longer or shorter. This causes a large change in a ratio of the width of the voltage-dividing channel of the voltage-dividing TFT to the width of the sub-channel of the sub-TFT, which greatly affects a voltage-dividing ratio of the voltage-dividing TFT to the sub-TFT, and affects the brightness of the sub-pixels at the prism connecting portion 101, resulting in an uneven display of a display panel.

SUMMARY OF THE INVENTION

The present disclosure provides an array substrate and a display panel comprising the same to solve the technical problem that a ratio of a width of a sub-channel of a sub-TFT to a width of a voltage-dividing channel of a voltage-dividing TFT is easily affected by changes in the widths of the channels, which greatly affects a brightness of a sub-pixel, making a display panel display uneven.

To solve the above problems, the present disclosure provides the following technical solutions.

The present disclosure provides an array substrate comprising a base substrate and a plurality of pixel units disposed on the base substrate in an array. Each of the pixel units comprises a main pixel electrode, a sub-pixel electrode, a first thin film transistor (TFT) electrically connected to the sub-pixel electrode, a second TFT electrically connected to the first TFT, and a third TFT electrically connected to the main pixel electrode. The first TFT comprises a first source electrode, a first drain electrode, a first channel, and a first semiconductor layer. At least a portion of the first channel is disposed between the first source electrode and the first drain electrode. The first channel comprises two or more subchannels. The first semiconductor layer comprises two or more semiconductor sublayers. Each of the semiconductor sublayers is disposed in a corresponding subchannel. The second TFT comprises a second source electrode, a second drain electrode, a second channel disposed between the second source electrode and the second drain electrode, and a second semiconductor layer disposed in the second channel.

In the array substrate, the first channel comprises a first subchannel and a second subchannel. The first semiconductor layer comprises a first semiconductor sublayer disposed in the first subchannel and a second semiconductor sublayer disposed in the second subchannel. The first subchannel or the second subchannel are disposed between the first source electrode and the first drain electrode.

In the array substrate, the first TFT and the second TFT are connected through the first source electrode and the second source electrode, or through the first drain electrode and the second drain electrode. The second TFT is disposed near the first TFT. The first subchannel is disposed between the first TFT and the second TFT. In the first channel, at least the second subchannel is disposed between the first source electrode and the first drain electrode.

In the array substrate, the first subchannel and the second subchannel are I-shaped and are disposed between the first source electrode and the first drain electrode.

In the array substrate, the first subchannel and the second subchannel are disposed parallel to each other. The first channel is U-shaped and is disposed between the first source electrode and the first drain electrode. The first subchannel and the second subchannel are respectively disposed in two parallel sides of the U-shaped first channel.

In the array substrate, the first channel is L-shaped and is disposed between the first source electrode and the first drain electrode. The first subchannel and the second subchannel are respectively disposed in two sides of the L-shaped first channel.

In the array substrate, the first subchannel is in communication with the second subchannel. The first semiconductor sublayer and the second semiconductor sublayer are integrated as one.

In the array substrate, the first subchannel and the second subchannel are spaced apart, and the first semiconductor sublayer and the second semiconductor sublayer are spaced apart between the first source electrode and the first drain electrode.

In the array substrate, the first subchannel and the second subchannel are U-shaped and are disposed between t the first source electrode and the first drain electrode.

The present disclosure further provides a display panel comprising a color filter substrate, the aforementioned array substrate, and a liquid crystal layer disposed between the color filter substrate and the array substrate.

In the display panel, the first channel comprises a first subchannel and a second subchannel. The first semiconductor layer comprises a first semiconductor sublayer disposed in the first subchannel and a second semiconductor sublayer disposed in the second subchannel. The first subchannel or the second subchannel are disposed between the first source electrode and the first drain electrode.

In the display panel, the first TFT and the second TFT are connected through the first source electrode and the second source electrode, or through the first drain electrode and the second drain electrode. The second TFT is disposed near the first TFT. The first subchannel is disposed between the first TFT and the second TFT. In the first channel, at least the second subchannel is disposed between the first source electrode and the first drain electrode.

In the display panel, the first subchannel and the second subchannel are I-shaped and are disposed between the first source electrode and the first drain electrode.

In the display panel, the first subchannel and the second subchannel are disposed parallel to each other. The first channel is U-shaped and is disposed between the first source electrode and the first drain electrode. The first subchannel and the second subchannel are respectively disposed in two parallel sides of the U-shaped first channel.

In the display panel, the first channel is L-shaped and is disposed between the first source electrode and the first drain electrode. The first subchannel and the second subchannel are respectively disposed in two sides of the L-shaped first channel.

In the display panel, the first subchannel is in communication with the second subchannel. The first semiconductor sublayer and the second semiconductor sublayer are integrated as one.

In the display panel, the first subchannel and the second subchannel are spaced apart, and the first semiconductor sublayer and the second semiconductor sublayer are spaced apart between the first source electrode and the first drain electrode.

In the display panel, the first subchannel and the second subchannel are U-shaped and are disposed between the first source electrode and the first drain electrode.

In the present invention, the first channel is divided into the two or more subchannels, and each of the subchannels is provided with one of the semiconductor sublayers, so that a number of the subchannels of the first TFT is greater than a number of the second channel of the second TFT, thereby increasing an amount of change in a width of the first channel of the first TFT. Compared with a current TFT structure, the present invention reduces an amount of change in an actual channel width ratio of the first TFT to the second TFT due to an exposure amount at a prism connecting portion and reduces influence of change in the exposure amount at the prism connecting portion on a voltage-dividing ratio of the first TFT to the second TFT. Therefore, the present invention reduces an amount of change in a brightness of a sub-pixel at the prism connecting portion and improves the problem of an uneven display of a display panel.

BRIEF DESCRIPTION OF THE SEVERAL VIEWS OF THE DRAWINGS

In order to more clearly illustrate the technical solutions in the embodiments of the present disclosure, a brief description of accompanying drawings used in the description of the embodiments of the present disclosure will be given below. Obviously, the accompanying drawings in the following description are merely some embodiments of the present disclosure. For those skilled in the art, other drawings may be obtained from these accompanying drawings without creative labor.

DESCRIPTION OF SPECIFIC EMBODIMENTS OF THE INVENTION

The following description of various embodiments of the present disclosure with reference to the accompanying drawings is used to illustrate specific embodiments that can be practiced. Directional terms mentioned in the present disclosure, such as "above", "below", "front", "back", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structures are indicated by the same reference numerals.

In the description of the present disclosure, it should be understood that location or position relationships indicated by terms, such as "center", "longitudinal", "transverse", "length", "width", "thickness", "up", "down", "front", "rear", "left", "right", "vertical", "horizontal", "top", "bottom", "within", "outside", "clockwise", and "counterclockwise" are location or position relationships based on illustration of the accompanying drawings, are merely used for describing the present disclosure and simplifying the description instead of indicating or implying the indicated apparatuses or elements should have specified locations or be constructed and operated according to specified locations, and Thereof, should not be intercepted as limitations to the present disclosure. Furthermore, terms such as "first" and "second" are used merely for description, but shall not be construed as indicating or implying relative importance or implicitly indicating a number of the indicated technical feature. Hence, the feature defined with "first" and "second" may explicitly or implicitly includes one or more such features. In the description of the present disclosure, a term "a plurality of" means "two or more" unless otherwise specifically limited.

In the present disclosure, it should be noted that, unless otherwise explicitly specified or defined, the terms such as "mount", "connect", and "connection" should be interpreted in a broad sense. For example, a connection may be a fixed connection, a detachable connection, or an integral connection. A connection may be a mechanical connection, an electrical connection, or a mutual communication. A connection may be a direct connection or may be an indirect connection by using an intermediate medium. A connection may be an internal connection or an interaction between two elements. It may be appreciated by those of ordinary skill in the art that the specific meanings of the aforementioned terms in the present disclosure can be understood depending on specific situations.

In the present disclosure, unless otherwise specifically specified or limited, a structure in which a first feature is "on" or "under" a second feature may comprise an embodiment in which the first feature directly contacts the second feature, and may also comprise an embodiment in which the first feature and the second feature are not in direct contact with each other, but are contacted via an additional feature formed therebetween. Furthermore, a structure in which a first feature is "on", "above", or "on top of" a second feature may comprise an embodiment in which the first feature is right or obliquely "on", "above", or "on top of" the second feature, or just means that a sea-level elevation of the first feature is greater than a sea-level elevation of the second feature. A structure in which a first feature "under", "below", or "on bottom of" a second feature may include an embodiment in which the first feature is right "beneath," "below," or "on bottom of" the second feature, and may also comprises an embodiment in which the first feature is right or obliquely "under", "below", or "on bottom of" the second feature, or just means that a sea-level elevation of the first feature is less than a sea-level elevation of the second feature.

The following description provides different embodiments or examples illustrating various structures of the present invention. In order to simplify the description of the present disclosure, only components and settings of specific examples are described below. They are only examples and are not intended to limit the present invention. Furthermore, reference numerals and/or letters may be repeated in different examples of the present disclosure. Such repetitions are for simplicity and clarity, which per se do not indicate relations among the discussed embodiments and/or settings. Furthermore, the present disclosure provides various examples of specific processes and materials, but those skilled in the art can be aware of application of other processes and/or use of other materials.

Technical solutions of the present disclosure are described below in conjunction with specific embodiments.

Please refer to FIG. 2 to FIG. 7, the present disclosure provides an array substrate 10 comprising a base substrate 11 and a plurality of pixel units disposed on the base substrate 11 in an array. Each of the pixel units at least comprises a main pixel electrode 12, a sub-pixel electrode 13, a first thin film transistor (TFT) 14 electrically connected to the sub-pixel electrode 13, a second TFT 15 electrically connected to the first TFT 14, and a third TFT 16 electrically connected to the main pixel electrode 12.

The first TFT 14 comprises a first source electrode 141, a first drain electrode 142, a first channel 143, and a first semiconductor layer 144. At least a portion of the first channel 143 is disposed between the first source electrode 141 and the first drain electrode 142. The first semiconductor layer 144 is disposed in the first channel 143. The second TFT 15 comprises a second source electrode 151, a second drain electrode 152, a second channel 153 disposed between the second source electrode 151 and the second drain electrode 152, and a second semiconductor layer 154 disposed in the second channel 153.

The first channel 143 comprises two or more subchannels. The first semiconductor layer 144 comprises two or more semiconductor sublayers. Each of the semiconductor sublayers is disposed in a corresponding subchannel.

It can be understood that an actual manufacturing process of a channel of a TFT comprises: sequentially forming a gate metal layer, an insulating layer, and a source/drain metal layer, then patterning the source/drain metal layer by an exposure process, and then forming a sub-channel of a sub-TFT and a voltage-dividing channel of a voltage-dividing TFT by an etching process and the patterned source/drain metal layer. A Nikon machine comprising a combination of prisms 100 as shown in FIG. 1 is commonly used in the exposure process. Because there is a certain difference between an exposure amount of a prism connecting portion 101 overlapping between the prisms 100 and an exposure amount of a prism body 102 of each of the prisms 100, there is a certain difference between an exposure amount of the insulating layer at the prism connecting portion 101 and an exposure amount of the insulating layer at the prism body 102. Specifically, light has a large diffraction angle at the prism connecting portion 101, which causes a size of an opening of a pattern of the insulating layer corresponding to the prism connecting portion 101 to become larger. Therefore, when the source/drain metal layer is etched, a part of the source/drain metal layer at openings at both ends of a channel is etched too much so that a width W of the etched channel becomes shorter. Furthermore, generally, in a current structure, there is a great difference between a width of a subchannel of a sub-TFT and a width of a subchannel of a voltage-dividing TFT. Therefore, an amount of change in a voltage-dividing ratio of the voltage-dividing TFT to the sub-TFT is large, which affects brightness change of a sub-pixel at the prism connecting portion 101. A size of an opening of a pattern of the insulating layer corresponding to the prism connecting portion 101 does not change. A brightness of the sub-pixel corresponding to the prism body 102 is different from a brightness of the sub-pixel corresponding to the prism connecting portion 101, thereby causing an uneven display of the display panel. It should be noted that an amount of shortening of a width of a channel is related to a number of openings of the channel. For example, in a common TFT structure, a channel generally has openings at both ends. According to the foregoing etching process, both ends of the channel are shortened by Δw, resulting in a shortening of a total width W of the channel by 2Δw. In the present invention, the first channel 143 is divided into the two or more subchannels, and each of the subchannels is provided with one of the semiconductor sublayers, so that a number of the subchannels of the first TFT 14 is greater than a number of the second channel 153 of the second TFT 15. The subchannels have a plurality of openings, thereby increasing an amount of change in a width of the first channel 143 of the first TFT 14. Compared with a current TFT structure, the present invention reduces an amount of change in an actual channel width ratio of the first TFT 14 to the second TFT 15 due to an exposure amount at a prism connecting portion 101 and reduces influence of change in the exposure amount at the prism connecting portion 101 on a voltage-dividing ratio of the first TFT 14 to the second TFT 15. Therefore, the present invention reduces an amount of change in the brightness of the sub-pixel corresponding to the prism connecting portion 101 and improves the problem of an uneven display of a display panel.

It should be noted that, as mentioned above, light has a large diffraction angle at the prism connecting portion 101, which causes a size of an opening of a pattern of the insulating layer corresponding to the prism connecting portion 101 to become larger. Therefore, when the source/drain metal layer is etched, a part of the source/drain metal layer at openings at both ends of a channel is etched too much, which not only causes the width W of the channel to become shorter, but also causes a length L of the channel to become longer. The length L of the channel is a distance between a source electrode and a drain electrode. In a current structural design, difference between channel lengths of TFTs is small. Increasing channel lengths has little effect on a voltage-dividing ratio of a voltage-dividing TFT to a sub-TFT, so it is not considered herein. In practical applications, a number of pixel units corresponding to the prism connecting portion 101 may reach 200, so the pixel units have a great influence and may make a display panel display unevenly. In addition, the width W of the channel described herein is based on a width of a semiconductor actually filled in the channel.

The first TFT 14, the second TFT 15, and the third TFT 16 may be a top gate structure, a bottom gate structure, or the like. In this embodiment, the first TFT 14, the second TFT 15, and the third TFT 16 are all bottom gate structures. The first TFT 14, the second TFT 15, and the third TFT 16 share a gate metal layer 17. The first TFT 14 is connected to the sub-pixel electrode 13. The second TFT 15 is connected to the first TFT 14. The first TFT 14 and the second TFT 15 are configured to control the brightness of the sub-pixel. The third TFT 16 is connected to the main pixel electrode 12. The third TFT 16 is configured to control the brightness of the main pixel. The second semiconductor layer 154 fills the second channel 153. The semiconductor sublayers fill the subchannels. In addition, in a specific structure, the first source electrode 141 and the first drain electrode 142 of the first TFT 14 can be interchanged, the second source electrode 151 and the second drain electrode 152 of the second TFT 15 can be interchanged, and a third source electrode and a third drain electrode of the third TFT 16 can be interchanged, which will not be described in detail herein.

In an embodiment, the first channel 143 comprises a first subchannel 1431 and a second subchannel 1432. The first semiconductor layer 144 comprises a first semiconductor sublayer 1441 disposed in the first subchannel 1431 and a second semiconductor sublayer 1442 disposed in the second subchannel 1432. The first subchannel 1431 and/or the second subchannel 1432 are disposed between the first source electrode 141 and the first drain electrode 142. It can be understood that the first sub-channel 1431 and the second sub-channel 1432 can be disposed between the first source electrode 141 and the first drain electrode 142, or only one of them is disposed between the first source electrode 141 and the first drain electrode 142. In a structure with at least three TFTs, two source electrodes or two drain electrodes of any two TFTs may be integrated as one, so that a portion of the first channel 143 is disposed between the first source electrode 141 and the first drain electrode 142. That is, the first subchannel 1431 or the second subchannel 1432 is disposed between the first source electrode 141 and the first drain electrode 142.

Figure 2:
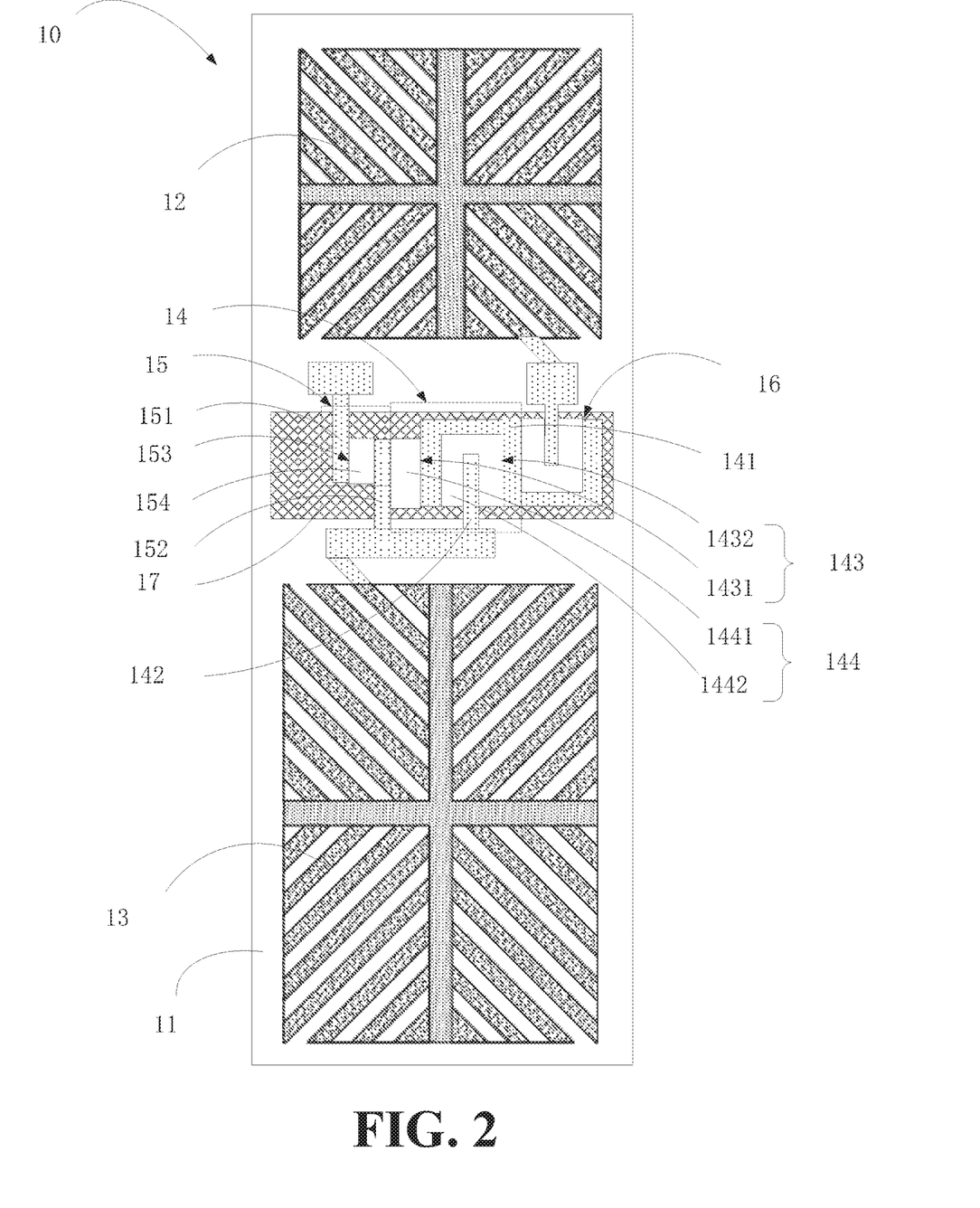
FIG. 2 is a schematic diagram of a first structure of an array substrate according to an embodiment of the present disclosure.

In an embodiment, as shown in FIG. 2, the first TFT 14 and the second TFT 15 are connected through the first source electrode 141 and the second source electrode 151, or through the first drain electrode 142 and the second drain electrode 152. The second TFT 15 is disposed near the first TFT 14. The first subchannel 1431 is disposed between the first TFT 14 and the second TFT 15. In the first channel 143, at least the second subchannel 1432 is disposed between the first source electrode 141 and the first drain electrode 142. In this embodiment, the first TFT 14 comprises the first subchannel 1431 and the second subchannel 1432, and thus has four openings. In a manufacturing process, a total width of the first channel 143 changes by 4Δw.

Specifically, the first TFT 14 and the second TFT 15 are connected through the first drain electrode 142 and the second drain electrode 152. The second drain electrode 152 of the second TFT 15 is disposed near the first source electrode 141 of the first TFT 14. The first subchannel 1431 is disposed between the second drain electrode 152 and the first source electrode 141. It can be understood that the first TFT 14 and the second TFT 15 are connected through the first drain electrode 142 and the second drain electrode 152, that is, the first TFT 14 and the TFT 15 share a drain electrode. Therefore, the first subchannel 1431 is not disposed between the first source electrode 141 and the first drain electrode 142. Furthermore, in the first channel 143, at least the second subchannel 1432 is disposed between the first source electrode 141 and the first drain electrode 142. The first channel 143 may further comprise a third subchannel 1433 and the like, which may be disposed between the first source electrode 141 and the first drain electrode 142 together with the second subchannel 1432. In some embodiments, the first channel 143 is entirely disposed between the first source electrode 141 and the first drain electrode 142.

Figure 3:
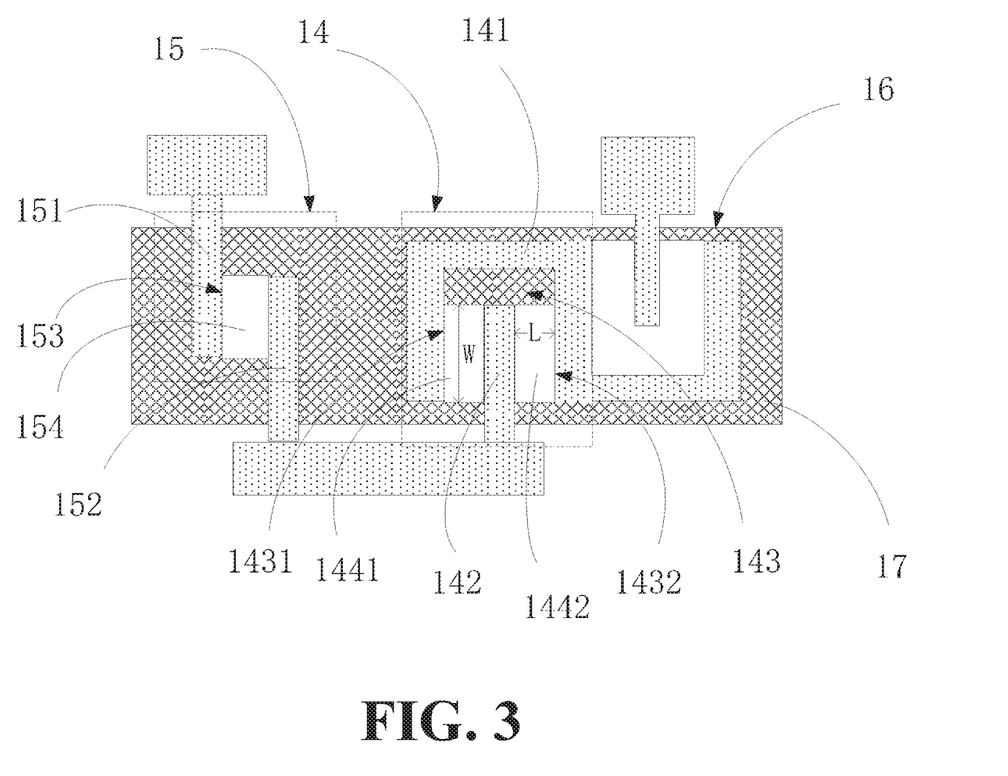
FIG. 3 is a schematic diagram of a second structure of an array substrate according to an embodiment of the present disclosure.
Figure 4:
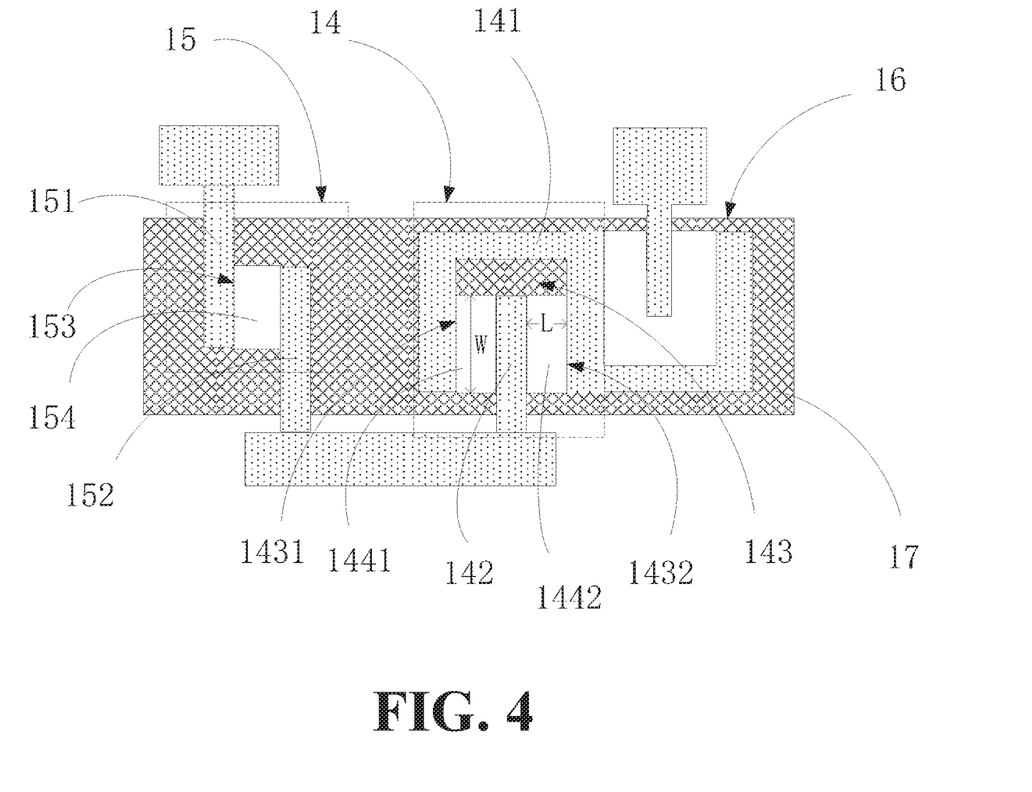
FIG. 4 is a schematic diagram of a third structure of an array substrate according to an embodiment of the present disclosure.
Figure 5:
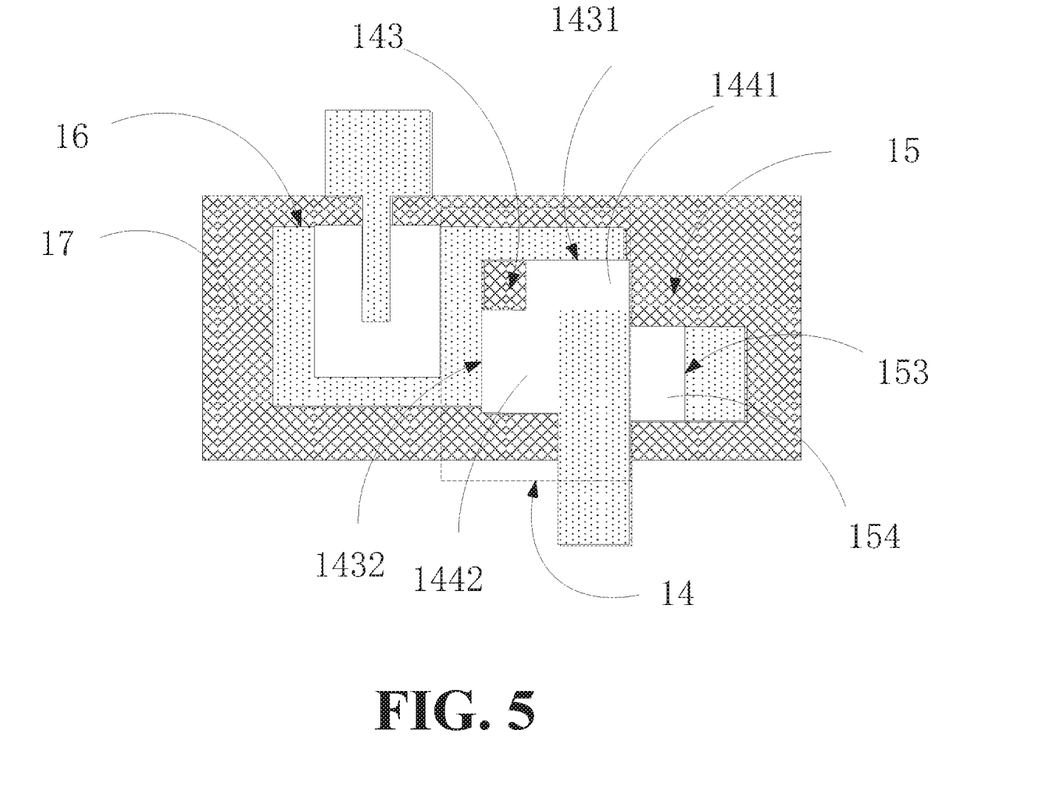
FIG. 5 is a schematic diagram of a fourth structure of an array substrate according to an embodiment of the present disclosure.

In an embodiment, as shown in FIG. 3 to FIG. 5, the first subchannel 1431 and the second subchannel 1432 are I-shaped and are disposed between the first source electrode 141 and the first drain electrode 142. The first channel 143 is entirely disposed between the first source electrode 141 and the first drain electrode 142. It can be understood that, in the case where the first subchannel 1431 and the second subchannel 1432 are I-shaped and are disposed between the first source electrode 141 and the first drain electrode 142, each of the first subchannel 1431 and the second subchannel 1432 has two openings, and the total width of the first channel 143 changes by 4Δw.

Specifically, as shown in FIG. 3, the first subchannel 1431 and the second subchannel 1432 are disposed parallel to each other. The first channel 143 is U-shaped and is disposed between the first source electrode 141 and the first drain electrode 142. The first subchannel 1431 and the second subchannel 1432 are respectively disposed in two parallel sides of the U-shaped first channel 143. Specifically, the first drain electrode 142 is disposed in the U-shaped first source electrode 141 so that the first channel 143 is U-shaped. The first subchannel 1431 and the second subchannel 1432 are respectively disposed in two parallel sides of the U-shaped first channel 143, that is, the first semiconductor sublayer 1441 and the second semiconductor sublayer 1442 are respectively filled in the two parallel sides of the U-shaped first channel 143. A bent connecting section of the U-shaped first channel 143 is not filled with semiconductor. It should be noted that the widths of the first subchannel 1431 and the second subchannel 1432 are greater than the width of the first drain electrode 142 in the U-shaped first channel 143.

In an embodiment, as shown in FIG. 4 and FIG. 5, the first channel 143 is L-shaped and is disposed between the first source electrode 141 and the first drain electrode 142. The first subchannel 1431 and the second subchannel 1432 are respectively disposed in two sides of the L-shaped first channel 143. The first subchannel 1431 has a certain angle to and is not parallel to the second subchannel 1432. Specifically, an included angle between the first subchannel 1431 and the second subchannel 1432 is same as an included angle between the two sides of the L-shaped first channel 143. Specifically, as shown in FIG. 4, the first subchannel 1431 is in communication with the second subchannel 1432. The first semiconductor sublayer 1441 and the second semiconductor sublayer 1442 are integrated as one. In addition, as shown in FIG. 5, the first subchannel 1431 and the second subchannel 1432 may be spaced apart, and the first semiconductor sublayer 1441 and the second semiconductor sublayer 1442 are spaced apart between the first source electrode 141 and the first drain electrode 142.

Figure 6:
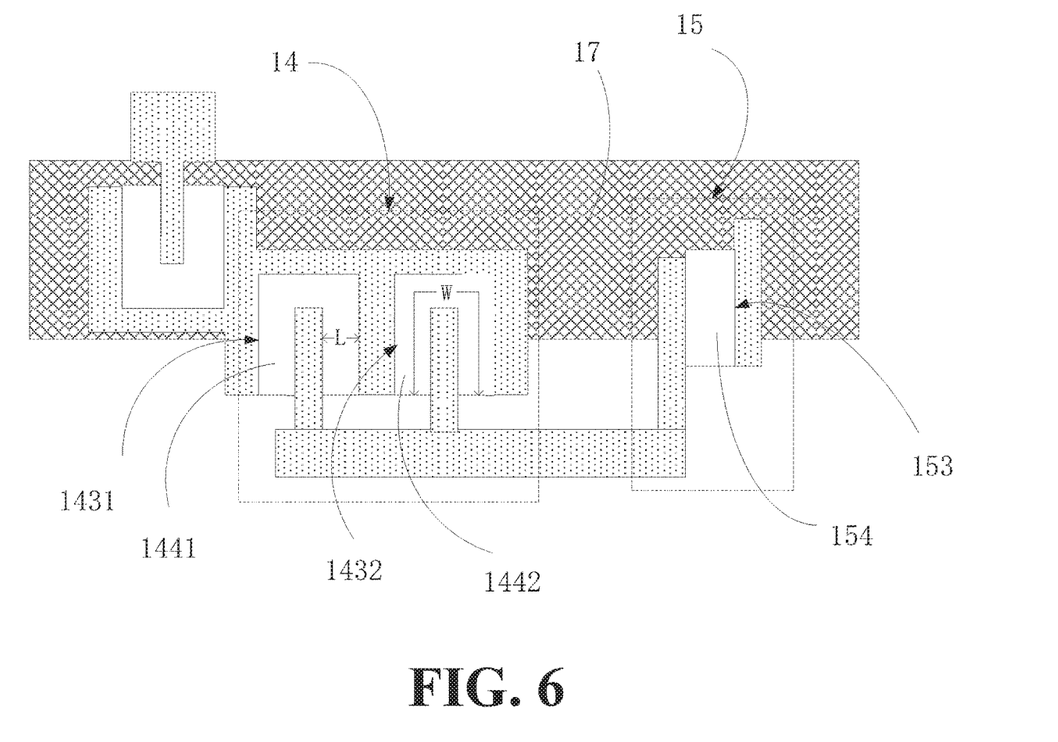
FIG. 6 is a schematic diagram of a fifth structure of an array substrate according to an embodiment of the present disclosure.

In an embodiment, as shown in FIG. 6, the first subchannel 1431 and the second subchannel 1432 are U-shaped and are disposed between the first source electrode 141 and the first drain electrode 142. It can be understood that the first channel 143 is double U-shaped and is disposed between the first source electrode 141 and the first drain electrode 142. Each of the first subchannel 1431 and the second subchannel 1432 has two openings, and the total width of the first channel 143 changes by 4Δw.

Figure 7:
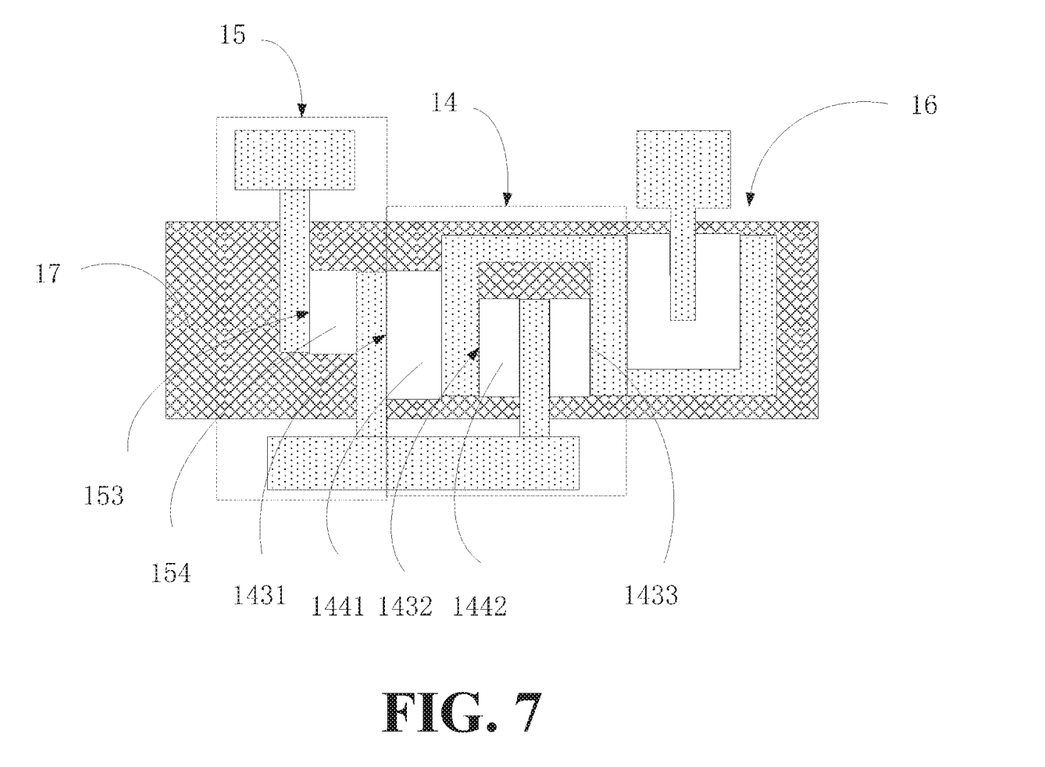
FIG. 7 is a schematic diagram of a sixth structure of an array substrate according to an embodiment of the present disclosure.

In an embodiment, as shown in FIG. 7, the structure shown in FIG. 2 is combined with the structure shown in FIG. 3. The first channel 143 further comprises a third subchannel 1433. The third subchannel 1433 is disposed between the first source electrode 141 and the first drain electrode 142 together with the second subchannel 1432. Specifically, the third subchannel 1433 and the second subchannel 1432 are I-shaped. The third subchannel 1433 and the second subchannel 1432 are disposed parallel to each other. The first channel 143 is U-shaped and is disposed between the first source electrode 141 and the first drain electrode 142. The third subchannel 1433 and the second subchannel 1432 are respectively disposed in two parallel sides of the U-shaped first channel 143. Each of the first subchannel 1431, the second subchannel 1432, and the third subchannel 1433 has two openings, and the total width of the first channel 143 changes by 6Δw.

Table 1 shows an amount of change in the voltage-dividing ratio of the first TFT 14 to the second TFT 15 in each of the array substrates 10 of FIG. 2 to FIG. 7 affected by channel size. As mentioned above, because there is a certain difference between an exposure amount of a prism connecting portion 101 overlapping between the prisms 100 and an exposure amount of a prism body 102 of each of the prisms 100, there is a certain difference between an exposure amount at the prism connecting portion 101 and an exposure amount at the prism body 102. Specifically, light has a large diffraction angle at the prism connecting portion 101, which causes a size of an opening of a pattern of the insulating layer corresponding to the prism connecting portion 101 to become larger. Therefore, when the source/drain metal layer is etched, a part of the source/drain metal layer at openings at both ends of a channel is etched too much so that a width W of the etched channel becomes shorter. Therefore, an amount of change in the voltage-dividing ratio controlling the brightness of the sub-pixels becomes larger, which affects the brightness of the sub-pixels at the prism connecting portion 101, resulting in an uneven display of a display panel.

TABLE 1 changes in voltage-dividing ratios of different array substrate structures

| | First TFT's width W1 (μm) | | Second TFT's width W2 (μm) | | Actual ratio of first TFT's width W1 to second TFT's width W2 (if Δw = 0.3 μm) | Change amount |
|---|---|---|---|---|---|---|
| | W1 design value | Change amount | W2 design value | Change amount | | |
| Theoretical reference | 26.6 | 0 | 6 | 0 | 6/26.6 = 22.55% | 0.00% |
| current reference | 26.6 | 2Δw | 6 | 2Δw | (6-2Δw)/(26.6-2Δw) = 20.76% | 1.79% |
| Structures of FIG. 2 and FIG. 3 | 26.6 | 4Δw | 6 | 2Δw | (6-2Δw)/(26.6-4Δw) = 21.25% | 1.30% |
| Structures of FIG. 4 to FIG. 6 | 26.6 | 4Δw | 6 | 2Δw | (6-2Δw)/(26.6-4Δw) = 21.25% | 1.30% |
| Structure of FIG. 7 | 26.6 | 6Δw | 6 | 2Δw | (6-2Δw)/(26.6-6Δw) = 21.77% | 0.78% |

Table 1 shows data of five groups. The five groups are a theoretical reference, a current reference, the structures of FIG. 2 and FIG. 3, the structures of FIG. 4 to FIG. 6, and the structure of FIG. 7. It can be understood that the theoretical reference has a theoretical value of the voltage-dividing ratio of the first TFT 14 to the second TFT 15. Under ideal conditions, an amount of change in a width W1 of the first TFT 14 and an amount of change in a width W2 of the second TFT 15 are both 0, and thus the voltage-dividing ratio of the second TFT 15 to the first the first TFT 14 to the second TFT 15 is a ratio of a design value of the width W1 of the first TFT 14 to a design value of the width W2 of the second TFT 15. As shown in Table 1, for example, the design value of the width W1 of the first TFT 14 is 26.6 μm, and the design value of the width W2 of the second TFT 15 is 6 μm, so that the voltage-dividing ratio of the first TFT 14 to the second TFT 15 is 22.55%. Furthermore, an amount of change in the voltage-dividing ratio of the first TFT 14 to the second TFT 15 with respect to a designed ideal voltage-dividing ratio is 0.00%.

Calculated in the above manner, taking Δw=0.3 μm as an example, in the current reference, change amounts of W1 and W2 in a current TFT structure are both 2Δw. An actual voltage-dividing ratio of the current reference is (6−Δw)/(26.6−2Δw)=20.76%. An amount of change in the actual voltage-dividing ratio of 20.76% of the current reference with respect to the ideal voltage-dividing ratio of 22.55% is 1.79%. Amounts of changes in the voltage-dividing ratios of the structures of FIG. 2 and FIG. 3, the structures of FIG. 4 to FIG. 6, and the structure of FIG. 7 are 1.30%, 1.30%, and 0.78%, respectively. Obviously, structures of the first TFT 14 and the second TFT 15 of the array substrate 10 of the present disclosure reduces sensitivity of the voltage-dividing ratio of the first TFT 14 to the second TFT 15 to channel size, and reduces the amount of the change in the voltage-dividing ratio of the first TFT 14 to the second TFT 15, thereby reducing an amount of change in the brightness of the sub-pixel and well solving the problem of an uneven display of a display panel.

Figure 8:
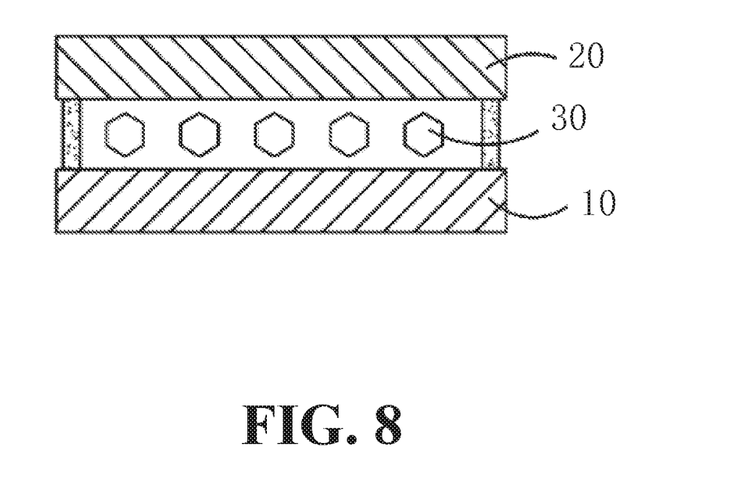
FIG. 8 is a schematic structural diagram of a display panel according to an embodiment of the present disclosure.

Based on the aforementioned array substrates 10, the present disclosure further provides a display panel. As shown in FIG. 8, the display panel comprises a color filter substrate 20, any one of the array substrates 10 described in the above embodiments, and a liquid crystal layer 30 disposed between the color filter substrate 20 and the array substrate 10.

In the present invention, the first channel 143 is divided into the two or more subchannels, and each of the subchannels is provided with one of the semiconductor sublayers, so that a number of the subchannels of the first TFT 14 is greater than a number of the second channel 153 of the second TFT 15, thereby increasing an amount of change in a width of the first channel 143 of the first TFT 14. Compared with a current TFT structure, the present invention reduces an amount of change in an actual channel width ratio of the first TFT 14 to the second TFT 15 due to an exposure amount at a prism connecting portion 101 and reduces influence of change in the exposure amount at the prism connecting portion 101 on a voltage-dividing ratio of the first TFT 14 to the second TFT 15. Therefore, the present invention reduces an amount of change in the brightness of the sub-pixel corresponding to the prism connecting portion 101 and improves the problem of an uneven display of a display panel.

The present application has been described in the above preferred embodiments, but the preferred embodiments are not intended to limit the scope of the present application, and those skilled in the art may make various modifications without departing from the scope of the present application. The scope of the present application is determined by claims.

What is claimed is:

1. An array substrate, comprising:
   a base substrate; and
   a plurality of pixel units disposed on the base substrate in an array, wherein each of the pixel units comprises:
   a main pixel electrode;
   a sub-pixel electrode;
   a first thin film transistor (TFT) electrically connected to the sub-pixel electrode and comprising:
   a first source electrode;
   a first drain electrode;
   a first channel, wherein at least a portion of the first channel is disposed between the first source electrode and the first drain electrode, and the first channel comprises two or more subchannels; and
   a first semiconductor layer comprising two or more semiconductor sublayers, wherein each of the semiconductor sublayers is disposed in a corresponding subchannel;
   a second TFT electrically connected to the first TFT and comprising:
   a second source electrode;
   a second drain electrode;
   a second channel disposed between the second source electrode and the second drain electrode; and
   a second semiconductor layer disposed in the second channel; and
   a third TFT electrically connected to the main pixel electrode;
   wherein the first channel comprises a first subchannel and a second subchannel disposed between the first source electrode and the first drain electrode, the first subchannel and the second subchannel are spaced apart from each other, and both the first subchannel and the second subchannel are U-shaped.

2. The array substrate according to claim 1, wherein the first semiconductor layer comprises a first semiconductor sublayer disposed in the first subchannel and a second semiconductor sublayer disposed in the second subchannel.

3. The array substrate according to claim 2, wherein:
   the first TFT and the second TFT are connected through the first source electrode and the second source electrode, or through the first drain electrode and the second drain electrode;
   the second TFT is disposed near the first TFT;
   the first subchannel is disposed between the first TFT and the second TFT; and
   in the first channel, at least the second subchannel is disposed between the first source electrode and the first drain electrode.

4. The array substrate according to claim 2, wherein:
   the first subchannel and the second subchannel are disposed parallel to each other; and
   the first channel is disposed between the first source electrode and the first drain electrode.

5. The array substrate according to claim 2, wherein the first semiconductor sublayer and the second semiconductor sublayer are spaced apart between the first source electrode and the first drain electrode.

6. The array substrate according to claim 1, wherein the first channel is double U-shaped.

7. A display panel, comprising a color filter substrate, an array substrate, and a liquid crystal layer disposed between the color filter substrate and the array substrate, wherein the array substrate comprises:
   a base substrate; and
   a plurality of pixel units disposed on the base substrate in an array, wherein each of the pixel units comprises:
   a main pixel electrode;
   a sub-pixel electrode;
   a first thin film transistor (TFT) electrically connected to the sub-pixel electrode and comprising:
   a first source electrode;
   a first drain electrode;
   a first channel, wherein at least a portion of the first channel is disposed between the first source electrode and the first drain electrode, and the first channel comprises two or more subchannels; and
   a first semiconductor layer comprising two or more semiconductor sublayers, wherein each of the semiconductor sublayers is disposed in a corresponding subchannel;
   a second TFT electrically connected to the first TFT and comprising:
   a second source electrode;
   a second drain electrode;
   a second channel disposed between the second source electrode and the second drain electrode; and
   a second semiconductor layer disposed in the second channel; and
   a third TFT electrically connected to the main pixel electrode;
   wherein the first channel comprises a first subchannel and a second subchannel disposed between the first source electrode and the first drain electrode, the first subchannel and the second subchannel are spaced apart from each other, and both the first subchannel and the second subchannel are U-shaped.

8. The display panel according to claim 7, wherein the first semiconductor layer comprises a first semiconductor sublayer disposed in the first subchannel and a second semiconductor sublayer disposed in the second subchannel.

9. The display panel according to claim 5, wherein:
the first TFT and the second TFT are connected through the first source electrode and the second source electrode, or through the first drain electrode and the second drain electrode;
the second TFT is disposed near the first TFT;
the first subchannel is disposed between the first TFT and the second TFT; and
in the first channel, at least the second subchannel is disposed between the first source electrode and the first drain electrode.

10. The display panel according to claim 8, wherein:
the first subchannel and the second subchannel are disposed parallel to each other; and
the first channel is disposed between the first source electrode and the first drain electrode.

11. The display panel according to claim 8, wherein the first semiconductor sublayer and the second semiconductor sublayer are spaced apart between the first source electrode and the first drain electrode.

12. The display panel according to claim 7, wherein the first channel is double U-shaped.

* * * * *